United States Patent
Yang et al.

(10) Patent No.: US 10,134,981 B1
(45) Date of Patent: Nov. 20, 2018

(54) FREE LAYER SIDEWALL OXIDATION AND SPACER ASSISTED MAGNETIC TUNNEL JUNCTION (MTJ) ETCH FOR HIGH PERFORMANCE MAGNETORESISTIVE RANDOM ACCESS MEMORY (MRAM) DEVICES

(71) Applicant: Headway Technologies, Inc., Milpitas, CA (US)

(72) Inventors: Yi Yang, Fremont, CA (US); Dongna Shen, San Jose, CA (US); Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/789,150

(22) Filed: Oct. 20, 2017

(51) Int. Cl.
| | |
|---|---|
| H01L 43/12 | (2006.01) |
| H01L 43/02 | (2006.01) |
| H01L 43/08 | (2006.01) |
| G11C 11/16 | (2006.01) |
| H01L 43/10 | (2006.01) |
| H01L 27/22 | (2006.01) |

(52) U.S. Cl.
CPC ............ *H01L 43/12* (2013.01); *G11C 11/161* (2013.01); *H01L 43/02* (2013.01); *H01L 43/08* (2013.01); *H01L 27/222* (2013.01); *H01L 43/10* (2013.01)

(58) Field of Classification Search
CPC ..... G11C 11/161; H01L 27/222; H01L 43/02; H01L 43/08; H01L 43/10; H01L 43/12
See application file for complete search history.

(56) References Cited

U.S. PATENT DOCUMENTS

| | | |
|---|---|---|
| 6,806,096 B1 | 10/2004 | Kim et al. |
| 6,984,529 B2 | 1/2006 | Stojakavic et al. |
| 7,001,783 B2 | 2/2006 | Costrini et al. |
| 7,060,194 B2 | 6/2006 | Kodaira et al. |
| 7,211,446 B2 | 5/2007 | Gaidis et al. |
| 7,374,952 B2 | 5/2008 | Kasko et al. |
| 7,696,551 B2 | 4/2010 | Xiao et al. |
| 8,722,543 B2 | 5/2014 | Belen et al. |
| 9,166,154 B2 | 10/2015 | Satoh et al. |
| 9,269,894 B2 | 2/2016 | Mudivarthi et al. |
| 9,275,713 B2 | 3/2016 | Guo |
| 9,362,490 B1 | 6/2016 | Xiao |
| 2003/0073251 A1 | 4/2003 | Ning |

(Continued)

*Primary Examiner* — Daniel P Shook
(74) *Attorney, Agent, or Firm* — Saile Ackerman LLC; Stephen B. Ackerman (57) ABSTRACT

A magnetic tunnel junction (MTJ) that avoids electrical shorts and has improved data retention is disclosed. An uppermost capping layer has a first sidewall that is coplanar with an interface between outer oxidized portions and a center ferromagnetic portion of a free layer (FL) that has a FL width (FLW). A dielectric spacer is formed on the first sidewall and oxidized outer FL portions. The pinned layer (PL) has a width (PLW) substantially greater than FLW, and a second sidewall thereon is formed by a self-aligned etch using the dielectric spacer and capping layer as an etch mask. A sidewall layer may be formed on the second sidewall and dielectric spacer but does not degrade MTJ properties since the sidewall layer does not contact the FL and PL center portions responsible for device performance. PL width>FLW ensures greater capability for data retention especially for FLW<60 nm.

25 Claims, 5 Drawing Sheets

(56) References Cited

U.S. PATENT DOCUMENTS

| | | |
|---|---|---|
| 2005/0277207 A1 | 12/2005 | Costrini et al. |
| 2006/0132983 A1 | 6/2006 | Osugi et al. |
| 2007/0215911 A1 | 9/2007 | Torng et al. |
| 2009/0078927 A1 | 3/2009 | Xiao et al. |
| 2009/0159563 A1 | 6/2009 | Jung |
| 2009/0261437 A1 | 10/2009 | Kang et al. |
| 2012/0012952 A1 | 1/2012 | Chen et al. |
| 2015/0061052 A1* | 3/2015 | Huang .................... H01L 43/08 257/421 |
| 2016/0020386 A1 | 1/2016 | Kim et al. |
| 2016/0211441 A1 | 7/2016 | Deshpande et al. |
| 2017/0025603 A1 | 1/2017 | Hare |

* cited by examiner

FREE LAYER SIDEWALL OXIDATION AND SPACER ASSISTED MAGNETIC TUNNEL JUNCTION (MTJ) ETCH FOR HIGH PERFORMANCE MAGNETORESISTIVE RANDOM ACCESS MEMORY (MRAM) DEVICES

RELATED PATENT APPLICATIONS

This application is related to Ser. No. 15/595,484, filed on May 5, 2017; and Ser. No. 15/465,644, filed on Mar. 22, 2017; which are assigned to a common assignee and herein incorporated by reference in their entirety.

TECHNICAL FIELD

The present disclosure relates to a method of forming an oxidized outer portion of a free layer and an overlying spacer adjoining a capping layer to eliminate electrical shorting as well as chemical and physical damage to MTJ sidewalls typically caused by conventional reactive ion etch (RIE) and ion beam etch (IBE) processes employed to form a plurality of MTJ cells thereby enabling an improved magnetoresistive ratio and greater pinning strength of the pinned layer on the free layer in each MTJ.

BACKGROUND

A MTJ memory element is also referred to as a MTJ cell and is a key component in magnetic recording devices, and in memory devices such as MRAM and spin torque transfer (STT)-MRAM. An important step in fabricating an array of MTJ cells is the etch transfer of a pattern in an overlying hard mask through a MTJ stack of layers to form an array of MTJ cells with a critical dimension (CD) that in state of the art devices is substantially less than 100 nm from a top-down view. The etch transfer process typically involves a plurality of etch steps involving one or both of RIE and IBE.

A MTJ stack of layers includes two ferromagnetic layers called the free layer (FL) and pinned layer (PL), and a tunnel barrier layer comprised of one or more dielectric layers between the FL and PL. Conductive layers (electrodes) above and below the PL/tunnel barrier/FL stack serve as electrical connections to a bit line and source line that are above and below the MTJ, respectively. The PL has a fixed magnetization preferably in a perpendicular-to-plane direction (perpendicular magnetic anisotropy or PMA) while the FL is free to rotate to a direction that is parallel (P) or anti-parallel (AP) to the PL magnetization direction thereby establishing a "0" or "1" memory state for the MTJ. The magnetoresistive ratio (DRR) is expressed by dR/R where dR is the difference in resistance between the P and AP magnetic states when a current is passed through the MTJ, and R is the minimum resistance value. The bottommost MTJ layer is usually a non-magnetic seed layer that promotes uniform growth in overlying layers, and enhances PMA in the overlying PL or FL. A capping layer (also referred to as a top electrode) such as Ta is generally formed as the uppermost MTJ layer and serves as a protective layer during subsequent physical and chemical etches.

Precise patterning techniques including photolithography and RIE are typically involved to define millions of MTJ cells in a MRAM array. The etching process to transfer the pattern in a photoresist mask through the underlying MTJ stack of layers is challenging since there are a variety of materials (magnetic alloys, non-magnetic metals, and dielectric films) in a MTJ stack of layers that each have a different etch rate when subjected to IBE or RIE. Also, due to a chemical reaction during RIE, portions of the MTJ layers adjoining the sidewall are easily damaged because of exposure to moisture, oxygen, and other oxidants such as methanol thereby lowering DRR and coercivity (Hc). This damage is cell size dependent meaning that the problem becomes more severe as cell size decreases.

To avoid chemical damage to MTJ sidewalls, pure physical etching techniques such as Ar based RIE or IBE have been applied. However, due to their non-volatile nature, metals such as Ta from the top and bottom electrodes, or ferromagnetic material from the PL or FL are easily redeposited on MTJ sidewalls, and cause electrical shorting that renders the device unusable. Physical damage to the sidewalls may also occur because of the highly energetic ions in physical etching. To remove physical damage to the sidewall or redeposited materials, additional steps such as horizontal RIE or IBE trimming have been employed, but these additional steps add to the fabrication cost and cycle time. The feasibility of surface trimming is also limited by MTJ cell density.

Another issue with conventional MTJ etch processing is that the volumes (width×thickness) of the FL and PL are equal or substantially the same. Thus, as cell size shrinks below 60 nm, the PL magnetization becomes too weak to stabilize the FL internal magnetic state. Furthermore, data retention is affected if the PL size and energy barrier ($E_B$) continue to decrease. Note that $E_B$ in a magnetic layer is related to thermal stability (A) shown in equation (1) below $$\Delta = kV/k_B T \qquad \text{Eq. (1)}$$

where k is a constant, V is the volume of the magnetic layer (PL), $k_B$ is the Boltzmann constant, and T is temperature.

In order to overcome the aforementioned issues that are associated with conventional MTJ patterning technology, new fabrication process flows are required so that MTJ cells having a CD substantially less than 60 nm may be formed while maintaining magnetic properties such as DRR, the integrity of MTJ sidewalls, and the pinning strength of the PL on the FL. Also, the new fabrication sequence must have high throughput and low cost in order to be competitive with other memory devices.

SUMMARY

A first objective of the present disclosure is to provide a MTJ cell having a structure that prevents electrical shorting, and avoids chemical damage to sidewalls of the pinned and free layers thereby enhancing magnetic properties including magnetoresistive ratio and Hc compared with conventional designs.

A second objective of the present disclosure is to provide a MTJ cell that satisfies the first objective and also has a pinned layer with improved data retention and enhanced pinning strength on the free layer, especially for MTJ cells with a CD≤60 nm.

Another objective of the present disclosure is to provide a method for patterning a MTJ stack such that RIE or IBE does not damage portions of the free layer and pinned layer that are responsible for device performance in the resulting MTJ cell.

According to a preferred embodiment, the first two objectives are achieved with a MTJ stack of layers having at least a pinned layer, free layer, a tunnel barrier between the free layer and pinned layer, and an uppermost capping layer also known as a top electrode. In some embodiments, a seed layer is employed as the bottommost MTJ layer. The MTJ stack is configured as a cell with a thickness in a perpendicular-to-plane direction, and having widths of the layers including free layer width (FLW) in an in-plane direction. In a preferred embodiment, the optional seed layer, pinned layer, and tunnel barrier layer are sequentially formed on a bottom electrode and have a first width (w1) and a first sidewall aligned substantially orthogonal to the bottom electrode top surface. The free layer contacts a top surface of the tunnel barrier, and a capping layer with a sidewall aligned orthogonal to the top surface of the free layer is formed on the free layer. A key feature is that the free layer has an oxidized outer portion, and a ferromagnetic center portion that defines the FLW. The FL center portion adjoins the outer portion at an interface that is essentially coplanar with the capping layer sidewall. Thus, each of the FL center portion and capping layer have a second width equivalent to the FLW where FLW<w1. Furthermore, there is a dielectric spacer formed on a top surface of the FL outer portion that adjoins the capping layer sidewall.

In some embodiments, there is a sidewall layer comprised of redeposited material or damaged material from the IBE or RIE that adjoins outer surfaces of the spacer and FL outer portion, and the first sidewall. However, center portions of the FL and pinned layer that are responsible for device performance do not contact the sidewall layer so that DRR, and Hc are enhanced compared with conventional MTJ designs. Moreover, since w1>FLW, the pinned layer has greater pinning strength on the FL than in the prior art where w1 is substantially equal to FLW.

The present disclosure also encompasses a method of fabricating the aforementioned MTJ cell. Preferably, the optional seed layer, pinned layer, tunnel barrier layer, FL, and capping layer are sequentially formed on the bottom electrode (BE). Then, a bottom anti-reflective coating (BARC) or a dielectric anti-reflective coating (DARC) is deposited on the capping layer. A photoresist layer is formed on the BARC or DARC, and is patternwise exposed by a photolithography method. After treatment with a photoresist developer solution, the resulting photoresist pattern is comprised of a plurality of photoresist islands and serves as an etch mask for a subsequent etch process involving one or both of RIE and IBE that transfers the pattern through the BARC or DARC, and capping layer. A first sidewall is formed on the BARC or DARC, and on the capping layer, and stops on the FL top surface.

Thereafter, plasma generated from $O_2$, $O_3$, or a mixture thereof with $N_2$, $NH_3$, $H_2O$, or another oxidant is employed to oxidize outer portions of the FL that are not protected by the overlying capping layer. Accordingly, the FL outer portions are transformed to oxidized FL portions that interface with the FL center portion, and the photoresist mask is removed. The interface is effectively an extension of the first sidewall and is essentially coplanar with said sidewall. Next, a dielectric spacer is deposited over the partially formed MTJ cell, and in the following step is removed by a vertical etch except on a section of the FL outer portions proximate to the capping layer. Thus, the spacer adjoins the first sidewall and has increasing width with increasing distance from a corner of the BARC or DARC top surface. The partially formed MTJ cell is then etched with one or both of RIE and IBE to remove portions of the oxidized FL, tunnel barrier layer, and pinned layer that are not protected by the spacer or capping layer thereby forming a second sidewall on the tunnel barrier layer, pinned layer, and seed layer that stops on the bottom electrode. In addition, the BARC or DARC is removed to expose the capping layer top surface. The second sidewall is essentially orthogonal to the BE top surface and determines the pinned layer width, which is greater than the FLW. Outer surfaces of the oxidized portion of the FL, and of the spacer adjoining the capping layer form a third sidewall that connects with the second sidewall proximate to a top surface of the tunnel barrier layer.

Typically, a sidewall layer comprised of redeposited MTJ materials is formed on the second and third sidewalls. However, the FL center portion including the interface with the oxidized FL, and a center portion of the pinned layer that determines device performance are not damaged or affected by the sidewall layer. Thereafter, an encapsulation layer comprised of one or more dielectric layers is deposited to fill spaces between adjacent MTJ cells. A chemical mechanical polish (CMP) or another planarization step is employed to form a top surface on the encapsulation layer that is coplanar with the capping layer top surface.

DETAILED DESCRIPTION

The present disclosure is a MTJ cell wherein a free layer has oxidized outer portions that form an interface with a center portion having a FLW where FLW is less than the width of the tunnel barrier and pinned layer, and a dielectric spacer is formed on the oxidized outer FL portions and adjoins the sidewall of a capping layer such that the sidewall and interface are coplanar, and electrical shorting is avoided. The present disclosure also encompasses a process of making the aforementioned MTJ cell wherein IBE or RIE etches do not physically or chemically damage the FL center portion or an inner portion of the pinned layer responsible for device performance. Although only one MTJ cell is depicted in the drawings, one skilled in the art will appreciate that a plurality of MTJ cells is formed in a typical memory device pattern. A process as defined herein may comprise one or more steps. The planes of the MTJ layers are in the x-axis and y-axis directions while a thickness of each layer is in a z-axis direction.

In related U.S. patent application Ser. No. 15/595,484, we disclosed a method of etching a MTJ stack of layers that comprises both of a noble gas and an oxidant in order to minimize chemical damage to MTJ sidewalls and the formation of redeposited material on the MTJ sidewalls that can cause electrical shorting. In actual practice, it is very difficult to entirely prevent chemical damage to sidewalls or redeposited material thereon. As a result, additional steps of sidewall trimming with horizontal RIE or IBE are often employed that drive higher fabrication cost and cycle time. Furthermore, conventional MTJ cell designs have substantially equal volumes (width) for the FL and pinned layer. As MTJ cell size continues to decrease below 60 nm, pinned layer magnetization becomes too weak to stabilize the FL magnetic state. Also, the pinned layer's energy barrier ($E_B$) decreases and adversely affects data retention.

In related patent application Ser. No. 15/465,644, we disclosed a process for patterning a MTJ such that the pinned layer width is substantially greater than the FLW. However, an IBE trim of the FL is required after the MTJ sidewall is formed in order to remove damaged material. More preferably, a MTJ patterning process is desired where no IBE trim is employed after MTJ sidewall formation so that throughput is improved and production cost is minimized.

Figure 1:
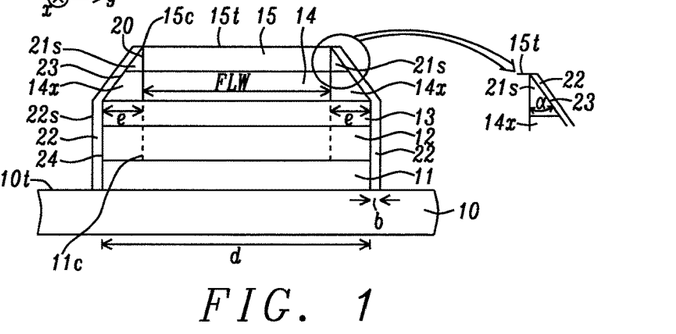
FIG. 1 is a cross-sectional view of a MTJ cell formed according to a first embodiment of the present disclosure wherein the free layer has oxidized outer portions and a width in a center ferromagnetic portion that is less than the pinned layer and tunnel barrier layer widths.

Referring to FIG. 1, a first embodiment of the present disclosure is depicted in a MTJ cell design that overcomes the issues associated with conventional MTJ cells and prior art fabrication methods as cell size shrinks below 60 nm in advanced devices. The MTJ cell is formed on a substrate that in one embodiment comprises a bottom electrode (BE) 10 in a memory device. The BE may be a multilayer structure and is typically embedded in a dielectric layer (not shown). Moreover, there are typically other device layers (not shown) below the BE such as a bit line (or source line) that is electrically connected to the BE.

The MTJ cell comprises a stack of layers 11-15 which are formed on a substrate that may be a bottom electrode (BE) 10 with top surface 10t. In the exemplary embodiment, seed layer 11, pinned layer 12, tunnel barrier layer 13, free layer (FL) 14, and capping layer 15 are sequentially formed on the BE. A key feature is that layers 11-13 have a sidewall 24 that is aligned substantially orthogonal to top surface 10t, and defines a pinned layer width d that is greater than the FLW in a center portion 14 of the free layer. Note that capping layer 15 has a sidewall 20 also aligned substantially orthogonal to top surface 10t, and which is coplanar with interface 14s between the FL center portion and outer oxidized portions 14x. In preferred embodiments, the difference (d−FLW) is at least 20 Angstroms, and in some MTJ cells is substantially greater than 20 Angstroms which means the base width e of the outer portion 14x is at least 10 Angstroms on each side of the FL center portion. Moreover, the FL outer portions have a stoichiometric oxidation state wherein essentially all metal atoms are completely oxidized. The advantage of having a pinned layer width, which is substantially larger than FLW, is that the pinned layer maintains sufficient magnetization in order to stabilize the FL magnetic moment, especially when FLW shrinks below 60 nm. Furthermore, the pinned layer's energy barrier does not decrease like that of the smaller FL and therefore provides improved data retention compared with prior art MTJ cells where FLW is proximate to pinned layer width.

Additional features of the MTJ cell of the first embodiment are a dielectric spacer 21s that is formed on the outer oxidized FL portions 14x, and on sidewall 20. The dielectric spacer serves as a buffer to prevent conductive materials in sidewall layer 22 from causing an electrical short in the MTJ cell. Note that the sidewall layer is deposited during an IBE or RIE step that forms sidewall 24 as explained in a later section. The aforementioned etch step also generates sidewall 23 on outer surfaces of dielectric spacer 21s and outer oxidized FL portions 14x. Note that sidewall 23 extends at an angle α from corner 15c of capping layer top surface 15t where α is greater than 0° but may be less than 30° depending on the desired base width e, and connects with sidewall 24 proximate to a top surface of tunnel barrier layer 13.

It should be understood that sidewall layer 22 has a width b that may be in the range of 5-10 Angstroms depending on the nature of the IBE or RIE used to generate sidewall 24, and is comprised of magnetic metals or alloys from the pinned layer 12, and metals or alloys from the seed layer 11 and BE 10. A similar sidewall layer in a conventional MTJ could readily cause an electrical short if forming a pathway around the tunnel barrier layer 13, and degrade magnetic performance. However, the presence of spacer 21s and outer oxidized FL portions 14x prevent an electrical connection to the MTJ cell above the tunnel barrier layer that essentially eliminates the likelihood of shorts in the present disclosure. The sidewall layer may also include outer regions of the pinned layer and seed layer that are chemically damaged or partially oxidized during an IBE or RIE that forms sidewall 24. In the present disclosure, a center portion of the pinned layer having a width proximate to FLW (within dashed lines 11c) that is primarily responsible for device performance does not comprise or adjoin the sidewall layer. Accordingly, magnetic performance is enhanced compared with prior art schemes having a single sidewall along all MTJ layers, and where a sidewall layer is formed on the single sidewall.

Sidewall layer 22 has an outer side 22s that in some embodiments is formed substantially parallel to sidewall 24 below a top surface of the tunnel barrier layer 13, and parallel to sidewall 23 above the top surface of the tunnel barrier layer. As described in a later section, an encapsulation layer is typically deposited to insulate adjacent MTJ cells. The encapsulation layer may comprise one or more dielectric layers wherein at least one dielectric layer adjoins outer side 22s. Since the sidewall layer has no detrimental effect on MTJ performance, there is no need to remove the layer by performing an IBE or RIE trimming step prior to encapsulation thereby improving throughput over conventional process schemes.

The present disclosure also encompasses a process of making the MTJ cell depicted in FIG. 1. Key aspects of the process flow are described with respect to the steps illustrated in FIGS. 2-7.

Figure 2:
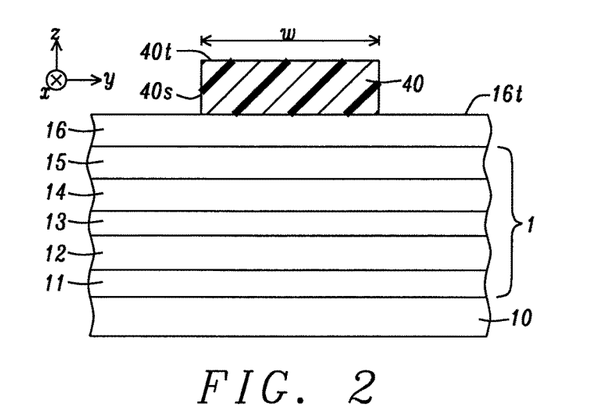
FIG. 2 is a cross-sectional view of a MTJ stack of layers on which a photoresist pattern has been formed and represents a first step in fabricating a MTJ cell according to an embodiment of the present disclosure.

Referring to FIG. 2, MTJ stack 1 is deposited on substrate 10 and in the exemplary embodiment has a bottom spin valve configuration wherein an optional seed layer 11, pinned layer 12, tunnel barrier layer 13, FL 14, and capping layer 15 are sequentially formed on the substrate. Each of the pinned layer and FL preferably have PMA with a magnetization aligned in a positive or negative z-axis direction. In other embodiments, at least one additional layer may be included in the aforementioned MTJ stack such as a Hk enhancing layer, which is a metal oxide layer between the FL and capping layer that enhances PMA in the free layer. The seed layer may be comprised of one or more of NiCr, Ta, Ru, Ti, TaN, Cu, Mg, or other materials typically employed to promote a smooth and uniform grain structure in overlying layers.

Pinned layer 12 may have a synthetic anti-parallel (SyAP) configuration represented by AP2/Ru/AP1 where an antiferromagnetic coupling layer made of Ru, Rh, or Ir, for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier layer. AP1 and AP2 layers may be comprised of CoFe, CoFeB, Co, or a combination thereof. In other embodiments, the reference layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer.

The tunnel barrier layer 13 is preferably a metal oxide layer comprising one or more of MgO, TiOx, AlTiO, MgZnO, $Al_2O_3$, ZnO, ZrOx, HfOx, and MgTaO. More preferably, MgO is selected as the tunnel barrier layer because it provides the highest magnetoresistive ratio, especially when sandwiched between two CoFeB layers, for example.

Free layer 14 may be Co, Fe, CoFe, or an alloy thereof with one or both of B and Ni, or a multilayer stack comprising a combination of the aforementioned compositions. In another embodiment, the FL may have a non-magnetic moment diluting layer such as Ta or Mg inserted between two CoFe or CoFeB layers that are ferromagnetically coupled. In an alternative embodiment, the FL has a SyAP configuration such as FL1/Ru/FL2 where FL1 and FL2 are two magnetic layers that are antiferromagnetically coupled, or is a laminated stack with inherent PMA described previously with respect to the pinned layer composition.

Capping layer 15 also serves as a hard mask during subsequent etch steps, which are used to fabricate a plurality of MTJ cells, and is typically comprised of one or more of Ta, Ru, TaN, Ti, TiN, and W. It should be understood that other capping layer materials including MnPt, or conductive oxides such as RuOx may be selected in order to provide high etch selectivity relative to underlying MTJ layers during an etch step that defines the pinned layer width in the completed MTJ cells and that stops on substrate 10. All layers in the MTJ stack may be deposited in a DC sputtering chamber of a sputtering system such as an Anelva C-7100 sputter deposition system that includes ultra high vacuum DC magnetron sputter chambers with multiple targets and at least one oxidation chamber. Usually, the sputter deposition process involves an argon sputter gas and a base pressure between $5 \times 10^{-8}$ and $5 \times 10^{-9}$ torr.

Once all layers 11-15 are formed, MTJ stack 1 may be annealed by heating to a temperature between about 360° C. to 400° C. for a period of up to a plurality of hours to grow a bcc structure in the pinned layer, FL, and tunnel barrier layer thereby enhancing PMA in the pinned layer and FL. The matching crystal structure in the aforementioned layers is also believed to improve the magnetoresistive ratio in MTJ cells formed by a subsequent patterning process.

As a first step in the MTJ patterning process according to the present disclosure, a BARC or DARC layer 16, and a photoresist layer are sequentially coated on capping layer 15. BARC or DARC with top surface 16t has a refractive index that minimizes reflection of light during the subsequent patternwise exposure thereby enabling more uniform photoresist islands 40 with less CD variation to be formed in the patterned photoresist layer. Next, a photolithography process comprised of a conventional patternwise exposure and developer sequence is employed to form a pattern in the photoresist layer that includes a plurality of islands with sidewall 40s. As indicated later by a top-down view in FIG. 9, the islands are in an array with a plurality of rows and columns. However, only one island is shown in FIG. 2 in order to simplify the drawing. Each island has a critical dimension w that in some embodiments is between 10 nm and 60 nm that corresponds to the CD required in state of the art memory devices. Note that some devices are circular such that w is formed in both of the x-axis and y-axis directions. However, the top-down shape of island 40 may be an ellipse or a polygon such that the y-axis dimension is different from the x-axis dimension.

Figure 3:
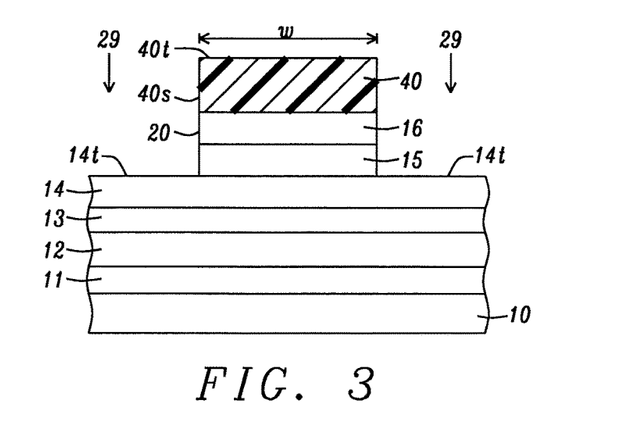
FIG. 3 is a cross-sectional view of the MTJ stack in FIG. 2 after an etching step is used to transfer the photoresist pattern through a capping layer and a BARC or DARC hard mask according to an embodiment of the present disclosure.

Referring to FIG. 3, an initial etch step 29 is employed and may be an IBE wherein ions are generated from one or more of Ar, Kr, Xe, or Ne, or may comprise RIE with a fluorocarbon or chlorocarbon gas to transfer the shape of island 40 through the BARC or DARC layer 16, and capping layer 15. Moreover, the IBE or RIE may include $O_2$. Accordingly, sidewall 20 is formed and is an extension of sidewall 40t to a top surface of 14t of FL 14. Note that CD w is effectively duplicated in layers 15, 16 in embodiments where sidewall 20 is substantially orthogonal to the FL top surface.

In some embodiments, a passivation step comprised of applying oxygen plasma or flowing oxygen into the process chamber immediately after the initial RIE or IBE is completed, and without breaking a vacuum, is performed to generate a smoother sidewall 20.

In the embodiments described herein, it should be understood that IBE typically comprises rotating the work piece (wafer) on which the MTJ stack of layers and substrate are formed. Moreover, the incident or penetration angle of noble gas ions directed at the substrate 10 may be varied between 0° and 90°. On the other hand, RIE involves a stationary wafer, and the resulting plasma is limited to a 90° direction (orthogonal to the wafer surface).

Figure 4:
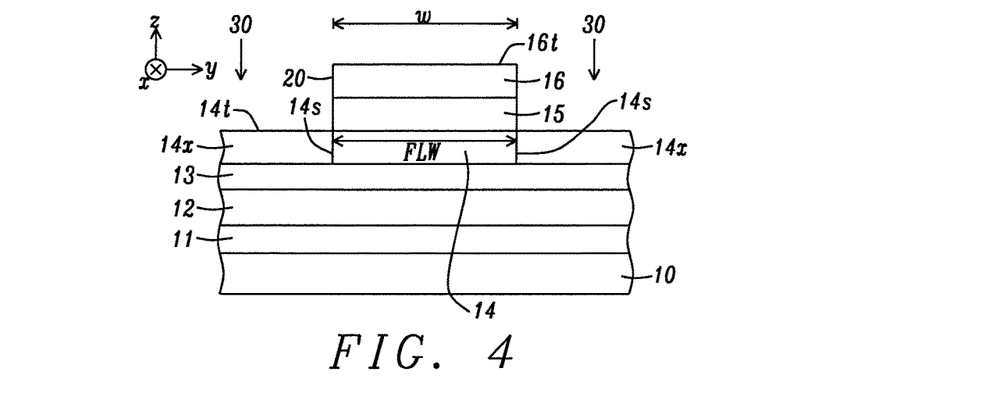
FIG. 4 is cross-sectional view of the MTJ stack in FIG. 3 after an oxygen plasma treatment is used to oxidize outer portions of a free layer that are not protected by the capping layer according to an embodiment described herein.

Referring to FIG. 4, a key feature according to a process of the present disclosure comprises step 30 wherein plasma comprised of pure $O_2$, $O_3$, or a mixture thereof with one or more of $N_2$, $NH_3$, $H_2O$, or $H_2O_2$, or another oxidant is produced with RIE conditions and used to oxidize outer portions 14x of the FL that are not covered by capping layer 15. As a result, FLW is defined by the width of center FL portion 14, which retains a ferromagnetic character. Interface 14s is formed between FL portions 14, 14x and is aligned below and coplanar with sidewall 20. A low bias power below 50 Watts is preferably used to prevent ions or plasma from penetrating into the underlying pinned layer and oxidizing a portion thereof. Preferably, the RIE conditions comprise a flow rate of oxidant from 10 to 500 standard cubic centimeters per minute (sccm), a RF power of 50 to 500 Watts, a bias power <50 Watts, and a chamber pressure from 5 to 50 mTorr.

Alternatively, step 30 may comprise a natural oxidation, thermal oxidation, or other well known oxidation methods to yield oxidized outer FL portions 14x. For example, the natural oxidation may comprise a flow rate of oxidant from 100 to 10000 sccm. Moreover, a thermal oxidation is preferably comprised of an oxidant that is pure $O_2$ or $O_3$, or a combination thereof with one or more of $N_2$, $NH_3$, $H_2O$, or $H_2O_2$. In some embodiments, the thermal oxidation is performed with a flow rate of oxidant from 100 to 10000 standard cubic centimeters per minute, and heating to a temperature from 100° C. to 400° C.

As mentioned earlier, the outer oxidized FL portions serve as an insulating buffer to prevent electrical shorting, and chemical damage to center FL portion 14, which is responsible for device performance including DRR, and Hc. Step 30 also removes the photoresist pattern including island 40.

Figure 5:
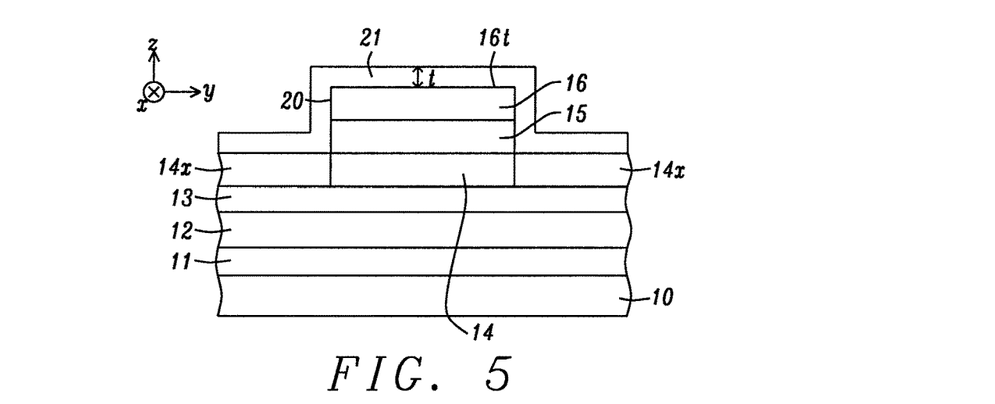
FIG. 5 is a cross-sectional view of the MTJ stack in FIG. 4 after a dielectric spacer layer is deposited on the oxidized free layer portions and hard mask according to an embodiment of the present disclosure.

Referring to FIG. 5, a dielectric layer 21 comprised of silicon oxide, silicon nitride, silicon oxynitride, silicon carbide, magnesium oxide, aluminum oxide, tantalum oxide, or another metal oxide, metal oxynitride, metal nitride, or a metal carbide, and with a thickness of at least 50 Angstroms, is deposited on top surfaces 14t, 16t, and on sidewall 20 by a physical vapor deposition (PVD), chemical vapor deposition (CVD), or plasma enhanced CVD (PECVD) method. Preferably, CVD is used in order to maximize the dielectric layer coverage on sidewall 20. The dielectric layer is generally not conformal meaning that a thickness t on top surface 16t is usually greater than a thickness thereof on sidewall 20.

Figure 6:
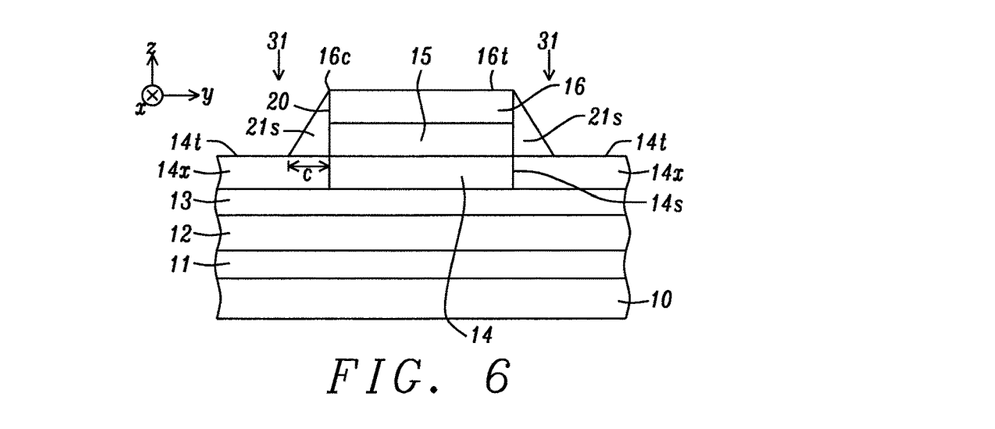
FIG. 6 is a cross-sectional view of the MTJ stack from FIG. 5 after another etching step is used to remove the spacer layer except along the sidewalls of the hard mask and capping layer according to an embodiment described herein.

Thereafter, as illustrated in FIG. 6, a vertical etch 31 (IBE or RIE) is performed that removes the dielectric layer 21 on top surface 16t, and from a considerable portion of top surface 14t. Preferably, etch step 31 yields a dielectric spacer hereinafter referred to as spacer 21s on a section of top surface 14t of the oxidized outer FL portions 14x, and on sidewall 20. The spacer contacts upper BARC or DARC corner 16c at top surface 16t and has increasingly greater width until reaching width c of at least 10 Angstroms at top surface 14t. IBE or RIE step 31 may be based on ions or plasma that are generated from a fluorocarbon, chlorine, or Argon. Spacer 21s and layers 15, 16 serve as an etch mask for the next etch step through the remaining layers 11-13 and 14x in the MTJ stack.

Figure 7:
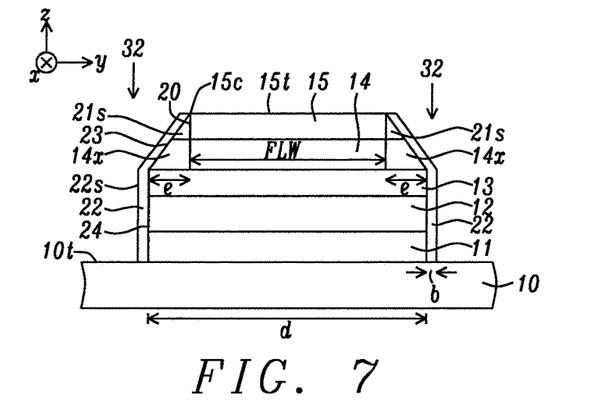
FIG. 7 is a cross-sectional view of the MTJ stack in FIG. 6 after a self aligned etch forms sidewalls on all MTJ layers below the spacer, and a sidewall layer on the completed MTJ cell according to an embodiment of the present disclosure.

Referring to FIG. 7, etch step 32 is performed and comprises IBE, RIE, or a combination thereof. In one preferred embodiment, etch step 32 is based on ions or plasma generated from a noble gas that is one of Ar, Kr, Ne, or Xe, and an oxidant that is one or more of methanol, ethanol, $O_2$, $H_2O_2$, $H_2O$, $N_2O$, or CO. Accordingly, sidewall 24 is formed on tunnel barrier layer 13, pinned layer 12, and seed layer 11, and stops on top surface 10t of the substrate. The BARC or DARC layer 16, and a portion of oxidized outer FL portions 14x that are not covered by spacer 21s are also removed. Note that sidewall 24 on layers 11-13 connects with sidewall 23 on outer FL portions 14x and spacer 21s proximate to a top surface of the tunnel barrier layer. Step 32 determines pinned layer width d, which in preferred embodiments is substantially larger than FLW. The tunnel barrier and optional seed layer also have width d. In other embodiments, either IBE or RIE based on a noble gas or an oxidant may be employed for etch step 32. Depending on the RIE or IBE conditions, base width e of the outer FL portions may be less than the maximum spacer width c prior to etch 32, but is preferably at least 10 Angstroms on each side of center FL portion 14.

In embodiments where etch step 32 comprises RIE conditions, plasma is preferably induced and maintained with a RF power between 600 Watts and 3000 Watts at a temperature proximate to room temperature. Moreover, the RF power applied to a top electrode may be different than the RF power applied to a bottom electrode in the RIE process chamber. With certain IBE or RIE conditions, sidewall 24 may be substantially orthogonal to top surface 10t as indicated in the exemplary embodiment. Furthermore, sidewall layer 22 having a width b of up to about 5 to 10 Angstroms is generally formed on sidewall 23 and sidewall 24 as a result of etch step 32. The sidewall layer is comprised of redeposited material from layers 11-13, outer oxidized FL 14x, and from substrate 10. When etch step 32 comprises an oxidant, the sidewall layer may also comprise damaged portions of layers 11-13 that result from oxidation. It should be understood that depending on pattern density (spacing between MTJ cells), bottom layer 11 between MTJ cells with larger spacing tends to be removed before bottom layer 11 between MTJ cells with closer spacing. As a result, etch step 32 may remove a portion of substrate that is exposed between the MTJ cells with larger spacing while regions of top surface 10t are finally uncovered between MTJ cells having smaller spacing.

Note that etch step 32 is a self-aligned process which means no photolithography process is needed to produce sidewall 24. Thus, overlay issues, that would be especially difficult for patterning a pinned layer below an already patterned FL, are avoided with the MTJ patterning sequence defined herein. Because the MTJ patterning sequence is more controlled by removing the variability in performance associated with sidewall layer 22 contacting or comprising active portions of the FL and pinned layer in prior art devices, we have discovered that MTJ switching current is more uniform as well.

Figure 8:
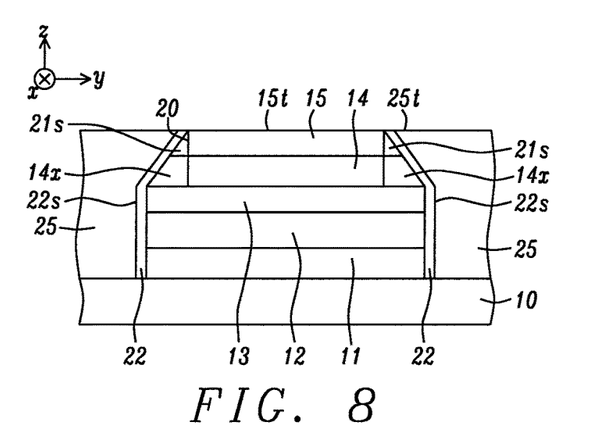
FIG. 8 is a cross-sectional view of the MTJ cell in FIG. 7 following deposition of an encapsulation layer and planarization to electrically insulate the MTJ cell according to an embodiment of the present disclosure.

Referring to FIG. 8, an encapsulation layer 25 that is comprised of a dielectric material is deposited on sidewall layer 22 and on top surface 15t in the MTJ cell in FIG. 7, and on other MTJ cells (not shown) in the memory array. Preferably, the encapsulation layer has a thickness of 5-250 nm and is one or more of a silicon oxide, silicon nitride, silicon oxynitride, silicon carbide, metal nitride, metal oxide, metal oxynitride, metal carbonitride including but not limited to $SiO_yN_z$, $AlO_yN_z$, $TiO_yN_z$, $SiC_yN_z$, MgO, $TaO_y$, and $AlO_y$, where y+z>0. Preferably, the encapsulation layer is deposited by PVD, CVD, ion beam deposition (IBD), or atomic layer deposition (ALD) without breaking the vacuum in the process chamber previously employed for etch step 32.

Thereafter, a chemical mechanical polish (CMP) process or another planarization method is performed to form a top surface 25t on the encapsulation layer that is coplanar with top surface 15t on capping layer 15. In some embodiments, the CMP process removes any DARC or BARC layer 16 remaining after etch step 32.

Figure 9:
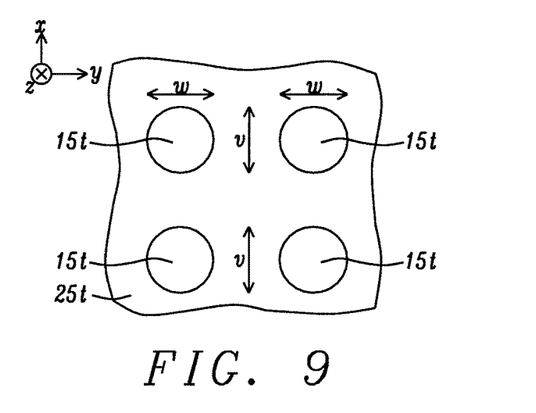
FIG. 9 is a top-down view of a plurality of MTJ cells having a circular shape in an array of rows and columns according to an embodiment described herein.

Referring to FIG. 9, the plurality of island shapes of the MTJ cells formed by the process flow of the present disclosure is depicted from a top-down view after the CMP or an alternative planarization process. MTJ cells at top surface 15t have a width w and length v. As explained previously, the MTJ cells are depicted with a circular shape where w=v, but may have elliptical or polygonal shapes in other embodiments such that w is unequal to v. Generally, millions of MTJ cells are formed in an array of rows and columns but only four are illustrated here to simplify the drawing.

Thereafter, a top conductive layer comprised of a plurality of parallel conductive lines (not shown) is formed by a conventional method on the MTJ cells and encapsulation layer 25 as appreciated by those skilled in the art. Accordingly, a write current to switch the magnetic state in the FL, or a read current to detect the actual magnetic state in the device, may be passed through a MTJ cell from a top conductive line to the bottom electrode 10, or in the reverse direction.

Figure 10:
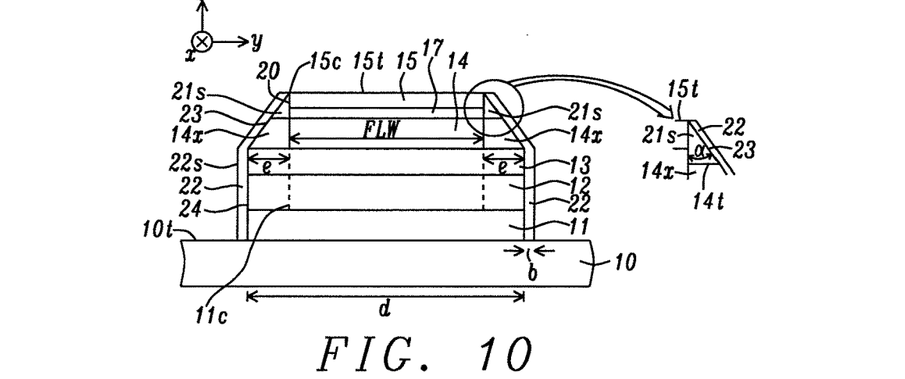
FIG. 10 is a cross-sectional view of a MTJ cell formed according to a second embodiment of the present disclosure wherein the free layer has oxidized outer portions and a width of a center ferromagnetic portion that is less than the pinned layer and tunnel barrier layer widths.

According to a second embodiment of the present disclosure shown in FIG. 10, the MTJ in FIG. 1 is modified to yield a MTJ cell with the insertion of a Hk enhancing layer 17 that contacts a top surface of center FL portion 14, and a bottom surface of capping layer 15. Sidewall 20 now extends from capping layer top surface 15t to FL top surface 14t, and determines an outer surface of the Hk enhancing layer that has a width substantially equal to FLW. Furthermore, dielectric spacer 21s adjoins sidewall 20 from the capping layer top surface to the FL top surface.

Figure 11:
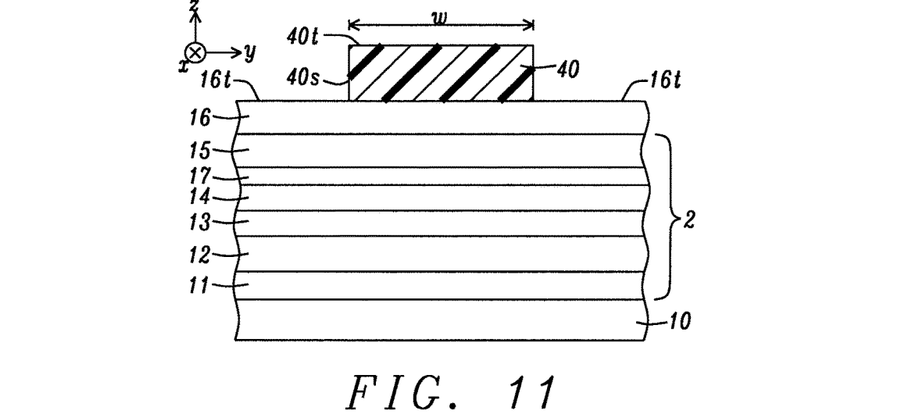
FIGS. 11-14 are cross-sectional views depicting intermediate steps during the fabrication of the MTJ cell in FIG. 10.

Referring to FIG. 11, a first step in the fabrication of the MTJ cell in FIG. 10 is formation of MTJ stack 2 wherein an optional seed layer 11, pinned layer 12, tunnel barrier layer 13, FL 14, Hk enhancing layer 17, and capping layer 15 are sequentially deposited on substrate 10. The Hk enhancing layer is preferably a metal oxide such as MgO or another metal oxide that was previously mentioned with respect to the tunnel barrier composition. The Hk enhancing layer is advantageously used to improve thermal stability in that a second FL/metal oxide interface is provided (in addition to the FL/tunnel barrier interface) thereby increasing PMA within the FL. After a BARC or DARC 16 is deposited on the capping layer, a photoresist pattern including island 40 with sidewall 40s is formed on capping layer top surface 16t similar to the first embodiment.

Figure 12:
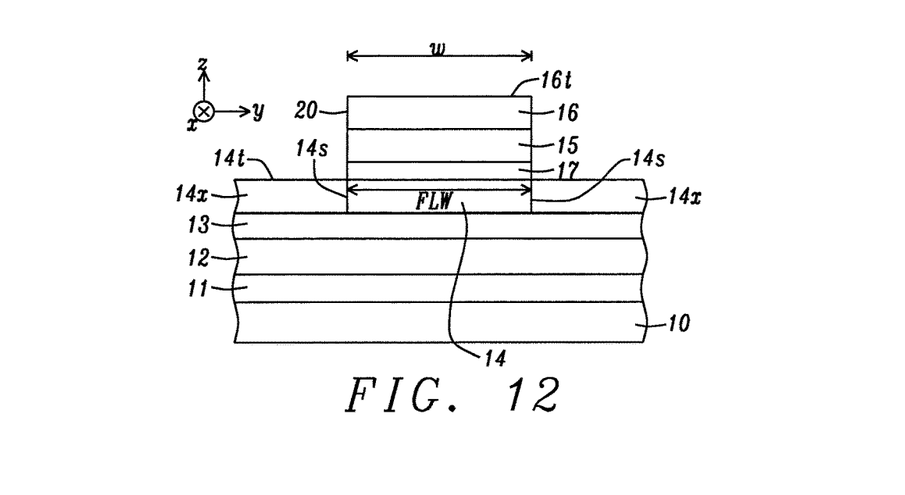

Thereafter, etch step 29 and plasma oxidation 30 described earlier are followed to generate the intermediate MTJ cell structure illustrated in FIG. 12. Note that sidewall 20 extends from a top surface of BARC or DARC 16 to top surface 14t of the outer oxidized FL portions 14x. In other words, each of layers 15-17 has a width w that is substantially equal to the width FLW in the FL center portion 14 that has an interface 14s with the outer oxidized FL portions.

Figure 13:
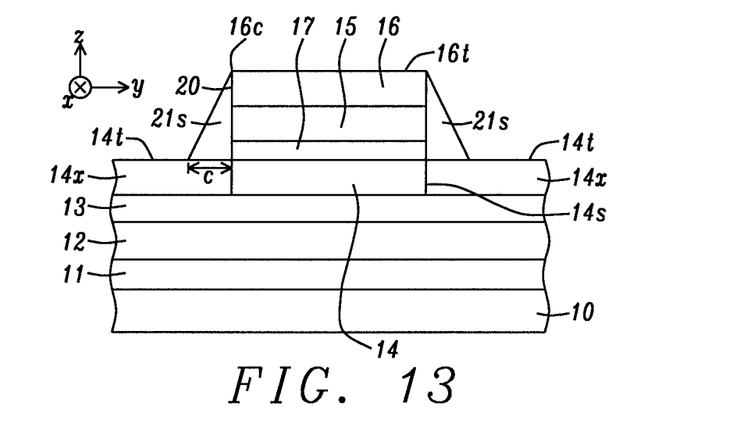

Next, as shown in FIG. 13, a dielectric layer is deposited and then a vertical etch is employed to provide dielectric spacer 21s that adjoins sidewall 20 on Hk enhancing layer 17, capping layer 15, and BARC or DARC 16. The dielectric spacer has a greater width with increasing distance from top corner 16c until reaching width c at top surface 14t on the oxidized outer FL portions 14x.

Figure 14:
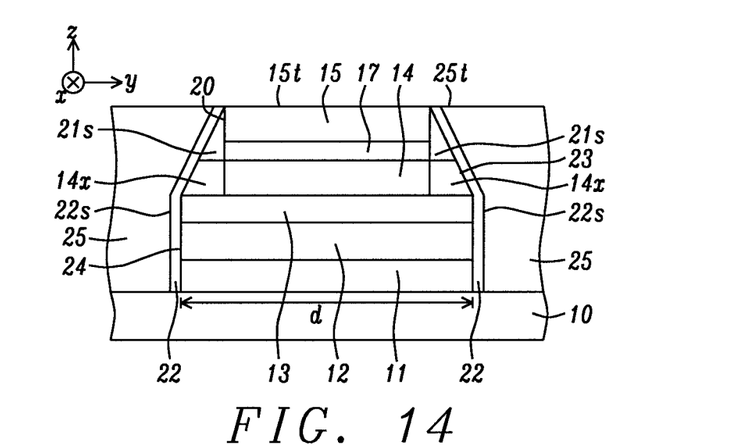

Referring to FIG. 14, an encapsulated MTJ cell is shown after the intermediate MTJ cell in FIG. 13 is etched to form sidewall 24, an encapsulation layer 25 is deposited, and a planarization step is performed as described previously with regard to FIGS. 7-8 in the first embodiment. Thus, the MTJ cell according to the second embodiment retains all the features and benefits of the first embodiment. Furthermore, the Hk enhancing layer 17 is expected to provide an additional advantage of higher thermal stability to protect against inadvertent switching of the free layer magnetization (not shown) from a (+) z-axis direction to a (−) z-axis direction, or vice versa because of stray fields or high temperature conditions.

In all embodiments disclosed herein, pinned layer width is substantially greater than FLW. Accordingly, data retention in the MTJ cell is believed to be improved compared with prior art MTJ cells having FLW essentially equal to pinned layer width since the pinned layer provides greater stabilization to FL magnetization, especially for FLW values <60 nm.

While this disclosure has been particularly shown and described with reference to, the preferred embodiment thereof, it will be understood by those skilled in the art that various changes in form and details may be made without departing from the spirit and scope of this disclosure.

We claim:

1. A magnetic tunnel junction (MTJ) structure, comprising:
    (a) a first stack of layers comprising an optional seed layer, a pinned layer, and a tunnel barrier layer that are sequentially formed on a substrate, and having a first width that is determined by a first sidewall which is aligned substantially orthogonal to a top surface of the substrate;
    (b) a second stack of layers comprising:
        (1) a free layer (FL) formed on the tunnel barrier layer wherein the FL has a ferromagnetic center portion, and oxidized outer portions that each form an interface with the center FL portion; and
        (2) a capping layer above the center FL portion wherein the center FL portion and capping layer have a free layer width (FLW) where FLW is less than the first width, and the capping layer has a second sidewall which is coplanar with the interface; and
    (c) a dielectric spacer that adjoins the second sidewall and contacts a top surface of the oxidized outer FL portions, and wherein the dielectric spacer has an outer surface that forms a third sidewall with an outer surface of the oxidized outer FL portion, and the dielectric spacer has increasing width with increasing distance from a top surface of the capping layer.

2. The MTJ of claim 1 wherein the first width is at least 20 Angstroms greater than the FLW such that a width of a bottom surface of the outer oxidized FL portions is at least 10 Angstroms on each side of the center FL portion.

3. The MTJ of claim 2 wherein FLW is less than 60 nm.

4. The MTJ of claim 1 wherein the substrate is a bottom electrode in a memory device.

5. The MTJ of claim 1 wherein the dielectric spacer is comprised of silicon oxide, silicon nitride, silicon oxynitride, silicon carbide, magnesium oxide, aluminum oxide, tantalum oxide, a metal oxide, metal oxynitride, metal carbide, or metal nitride.

6. The MTJ of claim 1 wherein the third sidewall connects with the first sidewall proximate to a top surface of the tunnel barrier layer.

7. The MTJ of claim 1 wherein the second stack of layers further comprises a Hk enhancing layer having the FLW, and that contacts a top surface of the center FL portion and a bottom surface of the capping layer, and is bounded by the second sidewall.

8. The MTJ of claim 1 wherein the oxidized outer FL portions have a stoichiometric oxidation state.

9. A method of fabricating a magnetic tunnel junction (MTJ) cell, comprising:
    (a) providing a MTJ stack of layers comprised of an optional seed layer, pinned layer, tunnel barrier layer, and free layer (FL) that are sequentially formed on a substrate, and an uppermost capping layer;
    (b) patterning the capping layer to form a first sidewall thereon and a first width;
    (c) oxidizing outer portions of the FL not covered by the capping layer thereby forming an interface between the oxidized outer FL portions and a center FL portion wherein the interface is coplanar with the first sidewall such that the center FL portion has the first width;
    (d) forming a dielectric spacer on the oxidized outer FL portions and on the first sidewall; and (e) performing a self-aligned etch where the dielectric spacer and capping layer serve as an etch mask to yield a second sidewall on the tunnel barrier layer, pinned layer, and optional seed layer such that the pinned layer has a second width substantially greater than the first width, and a third sidewall on outer surfaces of the oxidized outer FL portions and dielectric layer such that the third sidewall connects with the second sidewall proximate to a top surface of the tunnel barrier layer.

10. The method of claim 9 further comprised of forming a Hk enhancing layer on the free layer and contacting a bottom surface of the uppermost capping layer in step (a), and wherein the first sidewall is formed on the capping layer and Hk enhancing layer as a result of step (b).

11. The method of claim 9 wherein patterning the capping layer comprises:
(a) forming a bottom antireflective coating (BARC) or dielectric antireflective coating (DARC) on the capping layer;
(b) forming a photoresist layer on the BARC or DARC and patterning the photoresist layer to yield a photoresist island having the first width; and
(c) performing an ion beam etch (IBE) or reactive ion etch (RIE) to transfer the first width in the photoresist island through the BARC or DARC, and through the capping layer.

12. The method of claim 11 wherein forming the dielectric spacer is accomplished with a process comprising:
(a) depositing a dielectric layer on the oxidized outer FL portions, first sidewall, and a top surface of the BARC or DARC; and
(b) performing a vertical IBE or RIE to remove the dielectric layer on the BARC or DARC, and from a section of top surface on the oxidized outer FL portions.

13. The method of claim 11 wherein oxidizing the outer FL portions removes the photoresist layer including the photoresist island.

14. The method of claim 9 wherein forming the oxidized outer FL portions is performed with a natural oxidation, thermal oxidation, or with oxygen based plasma.

15. The method of claim 14 wherein the natural oxidation is comprised of an oxidant that is pure $O_2$ or $O_3$, or a combination thereof with one or more of $N_2$, $NH_3$, $H_2O$, or $H_2O_2$.

16. The method of claim 15 wherein the natural oxidation is generated by a flow rate of oxidant from 100 to 10000 standard cubic centimeters per minute (sccm).

17. The method of claim 14 wherein the thermal oxidation is comprised of an oxidant that is pure $O_2$ or $O_3$, or a combination thereof with one or more of $N_2$, $NH_3$, $H_2O$, or $H_2O_2$.

18. The method of claim 17 wherein the thermal oxidation comprises a flow rate of oxidant from 100 to 10000 sccm, and heating to a temperature from 100° C. to 400° C.

19. The method of claim 14 wherein the oxygen based plasma is comprised of an oxidant that is pure $O_2$ or $O_3$, or a combination thereof with one or more of $N_2$, $NH_3$, $H_2O$, or $H_2O_2$.

20. The method of claim 19 wherein the oxygen based plasma is generated by reactive ion etch conditions comprising a flow rate of oxidant from 10 to 500 sccm, a RF power of 50 to 500 Watts, a bias power <50 Watts, and a chamber pressure from 5 to 50 mTorr.

21. The method of claim 9 wherein a sidewall layer comprised of redeposited material and/or damaged portions of the optional seed layer, pinned layer, and tunnel barrier layer is formed on the second sidewall and third sidewall as a result of the self-aligned etch, and wherein the sidewall layer does not contact a center portion of the pinned layer having a width substantially equal to the first width.

22. The method of claim 9 further comprised of depositing an encapsulation layer that electrically insulates the MTJ cell from adjacent MTJ cells, and planarizing the encapsulation layer to have a top surface that is coplanar with a top surface of the capping layer.

23. The method of claim 9 wherein the second width is at least 20 Angstroms greater than the first width.

24. The method of claim 9 wherein the first width is less than about 60 nm.

25. The method of claim 9 wherein performing the self-aligned etch removes the DARC or BARC.

* * * * *